United States Patent
Cho et al.

(10) Patent No.: US 9,906,232 B1
(45) Date of Patent: Feb. 27, 2018

(54) RESOLUTION PROGRAMMABLE SAR ADC

(71) Applicant: Xilinx, Inc., San Jose, CA (US)

(72) Inventors: Junho Cho, Cupertino, CA (US); Parag Upadhyaya, Los Gatos, CA (US); Chi Fung Poon, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/455,915

(22) Filed: Mar. 10, 2017

(51) Int. Cl.
- *H03M 9/00* (2006.01)
- *H03M 1/00* (2006.01)
- *H04L 27/00* (2006.01)
- *H04B 1/00* (2006.01)
- *H04L 7/00* (2006.01)

(52) U.S. Cl.
CPC ........... *H03M 1/002* (2013.01); *H03M 1/001* (2013.01); *H04B 1/0014* (2013.01); *H04L 7/0087* (2013.01); *H04L 27/0002* (2013.01)

(58) Field of Classification Search
CPC .. H04B 1/0014; H04L 7/0087; H04L 27/0002
USPC .................................. 341/110–155
See application file for complete search history.

(56) References Cited

U.S. PATENT DOCUMENTS

| | | | | |
|---|---|---|---|---|
| 4,829,302 A * | 5/1989 | Oitzl | ...... | H03M 1/462 341/155 |
| 6,094,154 A * | 7/2000 | Lee | ...... | H03M 1/462 341/155 |
| 6,351,231 B1 * | 2/2002 | Price | ...... | H03M 1/462 341/155 |
| 7,265,708 B2 | 9/2007 | Mitra et al. | | |
| 7,956,787 B2 | 6/2011 | Westwick et al. | | |
| 8,134,487 B2 | 3/2012 | Harpe | | |
| 9,397,679 B1 * | 7/2016 | Harpe | ...... | H03M 1/1033 |
| 2002/0003487 A1 * | 1/2002 | Harada | ...... | H03M 1/0695 341/163 |
| 2004/0085999 A1 * | 5/2004 | Burnett | ...... | H04L 1/24 370/474 |
| 2005/0206545 A1 * | 9/2005 | Kobayashi | ...... | H03M 1/1285 341/145 |
| 2012/0026027 A1 * | 2/2012 | Steensgaard-Madsen | | H03M 1/466 341/161 |
| 2012/0133346 A1 * | 5/2012 | Ogawa | ...... | H02M 3/1588 323/282 |

(Continued)

OTHER PUBLICATIONS

Razavi, Behzad, "A Tale of Two ADCs: Pipelined Versus SAR," IEEE Solid-State Circuits Magaziine, Sep. 11, 2015, pp. 38-46, Issue 3, IEEE, Piscataway, New Jersey, USA.

(Continued)

*Primary Examiner* — Lam T Mai
(74) *Attorney, Agent, or Firm* — Robert M. Brush (57) ABSTRACT

An example successive approximation (SAR) analog-to-digital converter (ADC) includes: a track-and-hold (T/H) circuit configured to receive an analog input signal; a digital-to-analog converter (DAC); an adder having inputs coupled to outputs of the T/H circuit and the DAC; a comparison circuit coupled to an output of the adder and configured to perform a comparison operation; and a control circuit, coupled to an output of the comparison circuit, configured to: receive a selected resolution; gate the comparison operation of the comparison circuit based on the selected resolution; and generate a digital output signal having the selected resolution.

19 Claims, 9 Drawing Sheets

(56) References Cited

U.S. PATENT DOCUMENTS

| | | | |
|---|---|---|---|
| 2012/0242523 A1* | 9/2012 | Kapusta | H03M 1/0863 |
| | | | 341/150 |
| 2013/0099953 A1 | 4/2013 | Tsai et al. | |
| 2014/0035767 A1* | 2/2014 | Lin | H03M 1/38 |
| | | | 341/110 |
| 2015/0015229 A1* | 1/2015 | Teh | H02M 3/157 |
| | | | 323/284 |
| 2015/0263756 A1* | 9/2015 | Chiu | H03M 1/468 |
| | | | 341/118 |
| 2015/0372691 A1* | 12/2015 | Mandal | H03M 1/1245 |
| | | | 341/110 |
| 2016/0182078 A1* | 6/2016 | Shen | H03M 1/08 |
| | | | 341/122 |
| 2016/0248435 A1* | 8/2016 | Harpe | H03M 1/1033 |
| 2016/0254821 A1* | 9/2016 | Luo | H03M 1/125 |
| | | | 341/161 |
| 2017/0012637 A1* | 1/2017 | Venca | H03M 1/667 |
| 2017/0045578 A1* | 2/2017 | Okuda | G01R 31/3163 |
| 2017/0163276 A1* | 6/2017 | Chen | A61B 8/4494 |

OTHER PUBLICATIONS

Hua, Fan et al., "An 11-bit ENOB, accuracy-programmable, and non-calibrating time-mode SAR ADC," Journal of Semiconductors, Jan. 2013, 015010-1 to 015010-11, vol. 34, No. 1, IOP Publishing, Bristol, United Kingdom.

\* cited by examiner

| SAR Cycle | n-bit (Max Resolution) | | (n-1) bit | | (n-2) bit | |
|---|---|---|---|---|---|---|
| | Digital Out | sclk | Digital Out | sclk | Digital Out | sclk |
| 1st | d<n-1> | sclk<n-1> | d<n-1> | sclk<n-1> | d<n-1> | sclk<n-1> |
| 2nd | d<n-2> | sclk<n-2> | d<n-2> | sclk<n-2> | d<n-2> | sclk<n-2> |
| 3rd | d<n-3> | sclk<n-3> | d<n-3> | sclk<n-3> | d<n-3> | sclk<n-3> |
| 4th | d<n-4> | sclk<n-4> | d<n-4> | sclk<n-4> | d<n-4> | sclk<n-4> |
| ... | ... | ... | ... | ... | ... | ... |
| mth | d<n-m> | sclk<n-m> | d<n-m> | sclk<n-m> | d<n-m> | sclk<n-m> |
| ... | ... | ... | ... | ... | ... | ... |
| (n-2)nd | d<2> | sclk<2> | d<2> | sclk<2> | d<2> | sclk<2> |
| (n-1)st | d<1> | sclk<1> | d<1> | sclk<1> | | |
| nth | d<0> | sclk<0> | | | | |

RESOLUTION PROGRAMMABLE SAR ADC

TECHNICAL FIELD

Examples of the present disclosure generally relate to electronic circuits and, in particular, to a resolution programmable successive approximation (SAR) analog-to-digital converter (ADC).

BACKGROUND

High-speed analog-to-digital converter (ADC) front-ends in serial link receivers allow for implementing flexible, complex, and robust equalization in the digital domain, as well as easily supporting bandwidth-efficient modulation schemes, such as 4-level pulse amplitude modulation (PAM4) and duo-binary. These ADC-based serial link receivers are becoming more popular as they allow for more complex and flexible back-end digital signal processing as compared to binary or mixed-signal receivers. The power consumption, however, of these ADC front-ends and subsequence digital signal processing is a major design issue.

One of the main factors in power consumption is the resolution of the high-speed ADC. Much research has been performed to determine both the ADC resolution for optimal performance per power and the channel equalization techniques performed by the subsequent digital signal processor (DSP). The choice of ADC resolution is further complicated by the various channel applications. In general, as channel attenuation becomes worse, a higher resolution ADC is needed. For example, a 6~8 bit ADC resolution is suitable for use with equalization techniques for long channel (e.g., 25~30 decibels (dB)) applications. A conventional high-speed ADC provides digital output having a single resolution, which is inflexible and does not allow for optimal balancing of performance and power consumption across channel applications and channel equalization techniques.

SUMMARY

In an example, a successive approximation (SAR) analog-to-digital converter (ADC) includes: a track-and-hold (T/H) circuit configured to receive an analog input signal; a digital-to-analog converter (DAC); an adder having inputs coupled to outputs of the T/H circuit and the DAC; a comparison circuit coupled to an output of the adder and configured to perform a comparison operation; and a control circuit, coupled to an output of the comparison circuit, configured to: receive a selected resolution; gate the comparison operation of the comparison circuit based on the selected resolution; and generate a digital output signal having the selected resolution.

In another example, a receiver includes: an analog-front-end (AFE) configured to output an analog signal; an analog-to-digital converter (ADC) coupled to the AFE; a digital signal processor (DSP) coupled to the ADC; and an adaptation circuit coupled to the DSP, the ADC, and the AFE. The ADC includes a plurality of sub-ADCs, each including: a track-and-hold (T/H) circuit configured to receive the analog signal from the AFE; a digital-to-analog converter (DAC); an adder having inputs coupled to outputs of the T/H circuit and the DAC; a comparison circuit coupled to an output of the adder and configured to perform a comparison operation; and a control circuit, coupled to an output of the comparison circuit, configured to: receive a selected resolution from the adaptation circuit; gate the comparison operation of the comparison circuit based on the selected resolution; and generate a digital output signal having the selected resolution.

In another example, a method of analog-to-digital conversion in a successive approximation (SAR) analog-to-digital converter (ADC) includes :selecting a resolution; receiving an analog input signal; and performing a plurality of conversion cycles. Each of the plurality of conversion cycles includes: performing SAR operation for a number of SAR cycles based on the selected resolution; and outputting a digital sample having the selected resolution.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a resolution-programmable successive approximation (SAR) analog-to-digital converter (ADC) are described. In an example, the SAR ADC includes a track-and-hold (T/H) circuit, a digital-to-analog converter (DAC), an adder, a comparison circuit, and control logic. The T/H circuit is configured to receive an analog input signal. The adder is configured to determine the difference between the output of the T/H circuit and the output of the DAC. The comparison circuit is configured to compare the output of the adder against a threshold. The control circuit is configured to generate a digital output signal based on output of the comparison circuit. The digital output signal is fed back to the DAC. In examples, the control logic receives a selected resolution. The control logic gates the comparison operation of the comparison circuit based on the selected resolution. The digital output signal includes the selected resolution.

In an example, the control logic of the SAR ADC includes an asynchronous clock generator (ACG), SAR logic (SL), and a resolution selection (RS) circuit. The comparison circuit provides a digital signal pair as output. The ACG is configured to asynchronously generate a clock signal from the digital signal pair. The digital signal pair are either logical complements of each other or both have the same logic level based on the first clock signal (e.g., both are logic zero). The RS circuit is configured to generate a control signal based on a resolution select signal encoding the selected resolution. The ACG is configured to gate the clock signal based on the control signal generated by the RS. The SAR logic is configured to generate a plurality of sequential clock signals based on the digital signal pair. The RS circuit is configured to select one of the sequential clock signals as the control signal. In an example, the SAR logic includes a clock generator configured to generate an internal clock based on the digital signal pair, and a plurality of SAR cell circuits configured to generate the sequential clock signals and bits of the digital output signal based on the internal clock and the digital signal pair.

In a method of operation, the SAR ADC selects a resolution. The SAR ADC receives an analog input signal and performs a plurality of conversion cycles to generate a plurality of digital samples. During each conversion cycle, the SAR ADC performs SAR operation for a number of SAR cycles based on the selected resolution, and outputs a digital sample having the selected resolution. The SAR ADC performs a SAR operation by operating the comparison and control logic, asserting a gating signal based on the selected resolution, and suspending operation of the comparison and control logic in response to assertion of the gating signal. In an example, the SAR ADC has a maximum resolution of n. A selected resolution can be m, where m is an integer less than n and greater than or equal to zero. The number of SAR cycles performed in each conversion cycle is equal to m. The SAR ADC asserts the gating signal after m SAR cycles. The digital sample is generated based on m comparisons performed by the comparison logic. The comparison and control logic is suspended for a time period corresponding to m SAR cycles These and further aspects are described below with respect to the drawings.

Figure 1:
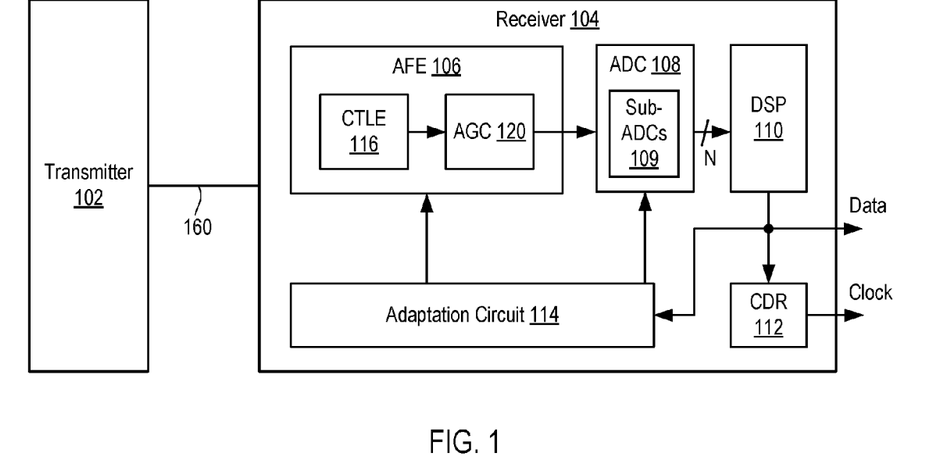
FIG. 1 is a block diagram of a communication system according to an example.

FIG. 1 is a block diagram of a communication system 100 according to an example. The communication system 100 includes a transmitter 102 coupled to a receiver 104 over a transmission medium 160. The transmission medium 160 can include an electrical path or optical path between the transmitter 180 and the receiver 104 and can include printed circuit board (PCB) traces, vias, cables, connectors, decoupling capacitors, optical cables, and the like.

The transmitter 102 drives serial data onto the transmission medium 160 using a digital baseband modulation technique. In general, the serial data is divided into symbols. The transmitter 102 converts each symbol into an analog voltage mapped to the symbol. The transmitter 102 couples the analog voltage generated from each symbol to the transmission medium 160. In some examples, the transmitter 102 uses a binary non-return-to-zero (NRZ) modulation scheme. In binary NRZ, a symbol is one bit of the serial data and two analog voltages are used to represent each bit. In other examples, the transmitter 102 uses multi-level digital baseband modulation techniques, such as pulse amplitude modulation (PAM), where a symbol includes a plurality of bits of the serial data and more than two analog voltages are used to represent each bit (e.g., 4-level PAM referred to as "PAM4"). The transmitter 102 can employ either single-ended or differential signaling. For purposes of clarity, various examples described herein assume that the transmitter 102 employs differential signaling (e.g., low-voltage differential signaling (LVDS)). Thus, the analog signal coupled to the transmission medium 160 includes a positive signal and negative signal and each symbol is encoded as a difference between the positive and negative signals.

The receiver 104 includes an analog front-end (AFE) 106, an analog-to-digital converter (ADC) 108, a digital signal processor (DSP) 110, a clock and data recovery (CDR) circuit ("CDR 112"), and an adaptation circuit 114. The AFE 106 can include a continuous time linear equalizer (CTLE) circuit ("CTLE 116") and an automatic gain control (AGC) circuit ("AGC 120").

An first input of the AFE 106 is coupled to the transmission medium 160 and an output of the AFE 106 is coupled to a first input of the ADC 108. In the example, the first input of the AFE 106 is a differential input, and the output of the AFE 106 is a differential output. A second input of the AFE 106 is coupled to a first output of the adaptation circuit 114. In the example, an input of the CTLE 116 is coupled to the transmission medium 160. An output of the CTLE 116 is coupled to an input of the AGC 120. An output of the AGC 120 is coupled to the first input of the ADC 108. In other examples, the order of the CTLE 116 and the AGC 120 is reversed.

An output of the ADC 108 is coupled to an input of the DSP 110. An output of the DSP 110 is coupled to an input of the CDR 112 and an input of the adaptation circuit 114. The first output of the adaptation circuit 114 is coupled to the second input of the AFE 106. A second output of the adaptation circuit 114 is coupled to a third input of the ADC 108.

In operation, the CTLE 116 receives an analog signal from the transmission medium 160. The CTLE 116 operates as a high-pass filter to compensate for the low-pass characteristics of the transmission medium 160. The peak of the frequency response of the CTLE 116 can be adjusted based on a CTLE adjust signal provided by the adaptation circuit 114. The AGC 120 receives the equalized analog signal from the CTLE 116. The AGC 120 adjusts the gain of the equalized signal based on a gain adjust signal provided by the adaptation circuit 114. The CTLE 116 and the AGC 120 operate similarly in examples where the AGC 120 precedes the CTLE 116.

The ADC 108 is a time interleaved (TI) ADC having a plurality of sub-ADCs 109. Each sub-ADC 109 is a successive approximate (SAR) ADC having a programmable resolution, as described further herein. The resolution of each sub-ADC 109 can be adaptively programmed by the adaptation circuit 114 for different channel applications and power optimizations. Thus, resolution programmability is applied to the receiver 104 (e.g., a multi-level modulated receiver) that allows for performance versus power optimization across various channel applications along with adaptive equalization techniques.

Each sub-ADC 109 has a resolution between one and n, where n is an integer greater than one. The ADC 108 outputs a digital signal having a width N, where N is equal to the maximum resolution of the ADC 108. In general, a digital signal is a discrete time, discrete amplitude signal. A digital signal having $2^X$ potential discrete amplitudes corresponds to a width of X bits (X>0). Such a digital signal is conveyed by a series of X-bit values (words, samples, etc.). The connection between the ADC 108 and the DSP 110 supports the transmission of N-bit values, where the resolution of each N-bit value is between one and n.

The DSP 110 performs various digital signal processing operations on the digital signal output by the ADC 108. For example, the DSP 110 can implement a decision feedback equalizer (DFE) or feed forward equalizer (FFE). The DSP 110 outputs a digital signal to each of the CDR 112 and the adaptation circuit 114. The CDR 112 recovers a clock from the digital signal output by the DSP. The digital signal output by the DSP 110 and the clock signal output by the CDR 112 can be used by subsequence circuitry, such as a physical coding sublayer (PCS) circuit, to recover the data transmitted by the transmitter 102.

The adaptation circuit 114 generates CTLE and AGC control signals from the digital signal output by the DSP 110. The adaptation circuit 114 also generates an ADC control signal from the digital signal output by the DSP 110. The control signals output by the adaptation circuit 114 are digital signals. In particular, the ADC control signal controls the resolution of the sub-ADCs 109. The adaptation circuit 114 can select a higher resolution for the sub-ADCs 109 in long channel applications to support robust equalization and adaptation. The adaptation circuit 114 can select a lower resolution for the sub-ADCs 109 in short channel applications for power reduction. In an example, the adaptation circuit 114 can use link training (either in cooperation with the transmitter 102 or through loopback) to determine the particular resolution for sub-ADCs 109 (e.g., using a pseudo-random binary sequence checker (PRBS) or the like).

Figure 2:
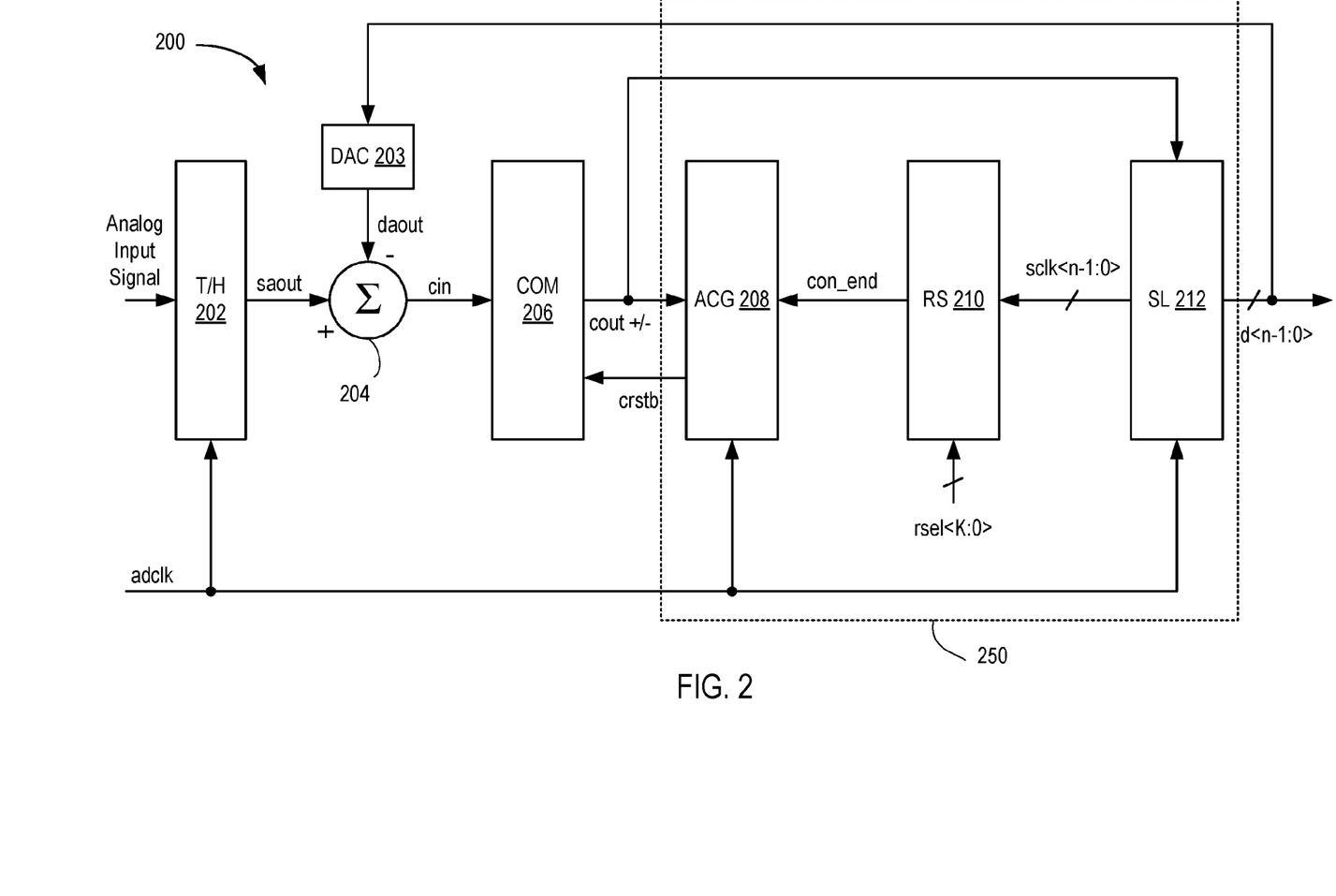
FIG. 2 is a block diagram depicting a successive approximation (SAR) analog-to-digital converter (ADC) according to an example.

FIG. 2 is a block diagram depicting an SAR ADC 200 according to an example. An instance of the SAR ADC 200 can be used to implement each of the sub-ADCs 109 in the ADC 108 described above with respect to FIG. 1. However, the SAR ADC 200 can also be used in other applications (e.g., as a stand-alone ADC, in applications other than a receiver, etc.). The SAR ADC 200 includes a track and hold (T/H) circuit ("T/H 202"), a digital-to-analog converter (DAC) 203, an adder 204, a comparator (COM) circuit ("COM 206"), an asynchronous clock generator (ACG) circuit ("ACG 208"), a resolution selection (RS) circuit ("RS 210"), and an SAR logic circuit ("SL 212"). The ACG 208, the RS 210, and the SL 212 comprise all or a portion of control logic 250 of the SAR ADC 200.

An input of the T/H 202 receives an analog input signal. The analog input signal can be a single-ended signal (as shown) or a differential signal. An output of the T/H 202 is coupled to an input of the adder 204. An output of the DAC 203 is coupled to another input of the adder 204. An output of the adder 204 is coupled to an input of the COM 206. An output of the COM 206 is coupled to an input of the ACG 208. An output of the ACG 208 is coupled to another input of the COM 206. Another input of the ACG 208 is coupled to an output of the RS 210. An input of the RS receives a resolution selection signal (rsel<K:0> or generally rsel). Another input of the RS 210 is coupled to an output of the SL 212. Another output of the SL 212 provides a signal d<n-1:0>. An input of the SL 212 is coupled to the output of the COM 206. An input of the DAC 203 is coupled to the output of the SL 212 to receive the signal d<n-1:0>. Additional inputs of the T/H 202, the ACG 208, and the SL 212 receive a digital signal (adclk).

The T/H 202 receives an analog input signal and performs a track-and-hold operation based on an edge of the adclk signal to generate an analog signal as output (saout). The adder 204 subtracts an analog signal (daout) generated by the DAC 203 from the signal saout and generates an analog signal (cin) as output. The COM 206 compares the signal cin against a threshold and outputs a digital signal pair cout+/− indicating results of the comparison. The signal pair cout+/− output by the COM 206 can have one of three states: both cout+ and cout− are de-asserted (referred to herein as the "zero state"); cout+ is asserted and cout− is de-asserted (referred to herein as the "+1 state"); and cout+ is de-asserted and cout− is asserted (referred to herein as the "−1" state). The signal pair cout+/− does not have a state where both signals are asserted. As used herein, "assert" means transition to logic '1' and de-assert means transition to logic '0'. The comparison operation performed by the COM 206 is gated by a digital signal (crstb). When the digital signal crstb is asserted, the COM 206 performs the comparison operation, resulting in either the +1 or −1 comparison states. When the digital signal crstb is de-asserted, the COM 206 does not perform the comparison, resulting in the zero comparison state.

Figure 3:
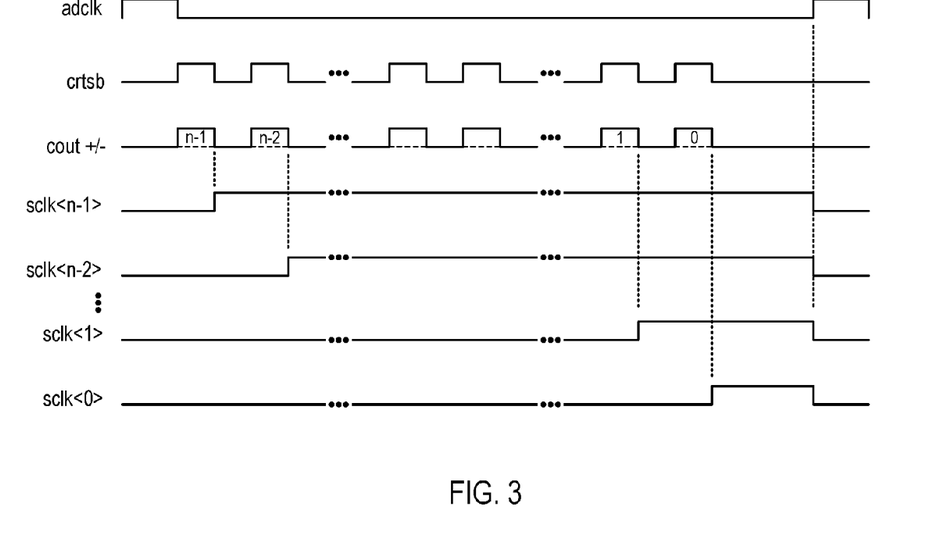
FIG. 3 is a signal diagram depicting example signals of the SAR ADC shown in FIG. 2.

FIG. 3 is a signal diagram depicting example signals of the SAR ADC 200 shown in FIG. 2. The gate delays are omitted from the signals shown in FIG. 3. The signals in FIG. 3 are for the case where the resolution of the SAR ADC 200 is set to n (i.e., the maximum resolution). The signal adclk is an ADC conversion clock and SAR operation is completed within one clock cycle of the signal adclk ("conversion cycle"). Each pulse of the cout+ or cout− signal corresponds to a SAR cycle and there are n possible SAR cycles in each conversion cycle, depending on the selected resolution. That values of the bits d<n-1>, d<n-2>, . . . , d<0> of the output signal d<n-1:0> are set in the SAR cycles (n-1), (n-2), . . . , 0, respectively. The SAR cycle (n-1) occurs first in time and the SAR cycle 0 occurs last in time. During each SAR cycle, one of the cout+ or cout− signals is asserted (e.g., the comparison state is +1 or −1). The crstb is a clock signal for the COM 206. Both signals cout+ and cout− are de-asserted when the signal crstb is de-asserted. The ACG 208 generates the crstb signal asynchronously based on the signal pair cout+/−, as described further below.

Referring to FIGS. 2 and 3, the SL 212 generates n sequential clock signals sclk<n-1> . . . sclk<0>. Each sequential clock signal sclk<n-1> . . . sclk<0> has a rising edge aligned with the end of a SAR cycle, and a falling edge aligned with the rising edge of the signal adclk. As shown in FIG. 3, the clock signal sclk<n-1> has a rising edge aligned SAR cycle (n-1). The clock signal sclk<n-2> has a rising edge aligned SAR cycle (n-2). The clock signal sclk<1> has a rising edge aligned with SAR cycle 1. The clock signal sclk<0> has a rising edge SAR cycle 0. The SL 212 generates the sequential clock signals based on the signal pair cout+/− and the adclk signal, as described further below.

The RS 210 uses one of the sequential clock signals sclk<n-1> . . . sclk<0> to terminate SAR operation within each conversion cycle according to a resolution requirement specified by the signal rsel<K:0> (where K=$\log_2$(n)). The RS 210 de-asserts the signal con_end to continue SAR operation within the conversion cycle. The RS 210 asserts the signal con_end to suspend SAR operation prior to the end of the conversion cycle. When the RS 210 asserts the signal con_end, the ACG 208 de-asserts the signal crstb, which terminates the comparison operation performed by COM 206 (resulting in the zero comparison state for each remaining SAR cycle in the conversion cycle).

The SL 212 generates an output signal d<n-1:0> having a resolution n as selected based on the signal rsel. One bit of the output signal d<n-1:0> is resolved during each SAR cycle starting from the most-significant bit (MSB). The DAC 203 converts the output signal d<n-1:0> into an analog signal daout. The adder 204 subtracts the signal daout from the signal saout to generate the signal cin. After n SAR cycles, the value of the output signal d<n-1:0> is a quantized representation of the analog input signal. If the selected resolution is less than the maximum resolution, one or more of the least significant bits (LSBs) of the output signal d<n-1:0> will be logic '0' for every output sample.

Figure 4:
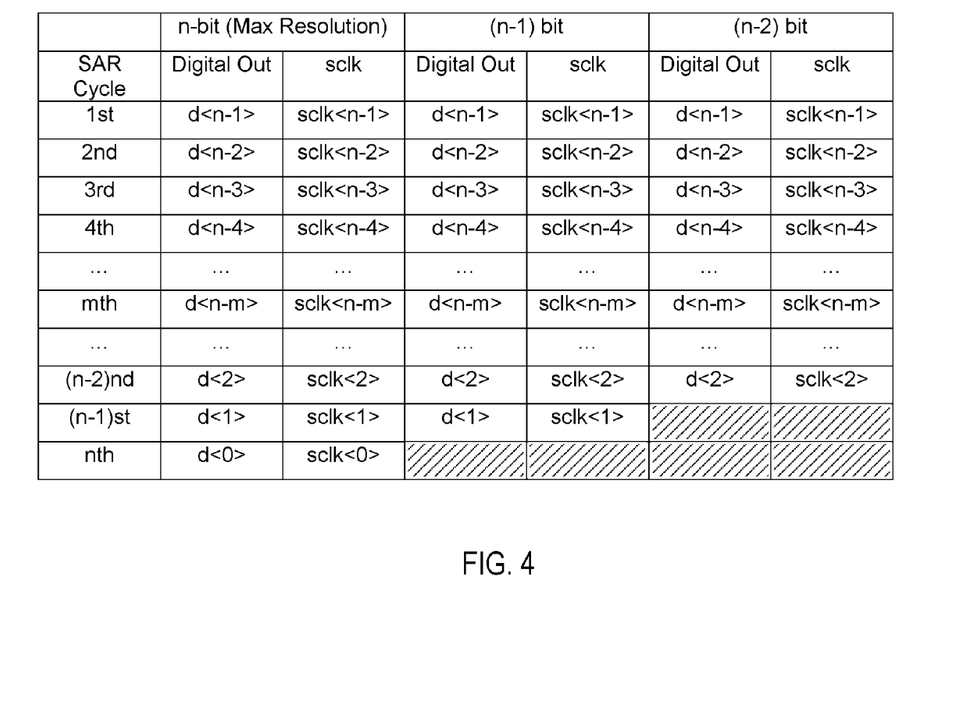
FIG. 4 depicts a table that shows relationships between the output signal and the sequential clock signals for programmed resolution in the SAR ADC of FIG. 2.

FIG. 4 depicts a table that shows relationships between the output signal and the sequential clock signals for resolutions of n, (n-1), and (n-2). For the resolution of n bits, which is the maximum resolution, the SL 212 generates the sclk signals sequentially from sclk<n-1> to sclk<0> and the RS 210 uses the signal sclk<0> to terminate SAR operation. For the resolution of (n-1) bits, the SL 212 generates the sclk signals sequentially from sclk<n-1> to sclk<1> and the RS 210 uses the signal sclk<1> to terminate SAR operation. For the resolution (n-2) bits, the SL 212 generates the sclk signals sequentially from sclk<n-1> to sclk<2> and the RS 210 uses the signal sclk<2> to terminate SAR operation.

Returning to FIG. 2, the resolution of the SAR ADC 200 is controlled through the signal rsel. For example, in long channel applications, the RS 210 can be controlled through the signal rsel to use the last sequential clock sclk<0> to terminate SAR operation and generate a digital output having the maximum resolution of n. For short channel operations, the RS 210 can be controlled through the signal rsel to use an earlier sequential clock to termination SAR operation and generate a digital output having a resolution less than the maximum resolution of n (for power reduction). When the SAR ADC 200 is used in other applications, the resolution can be controlled based on any factor as desired.

Figure 5:
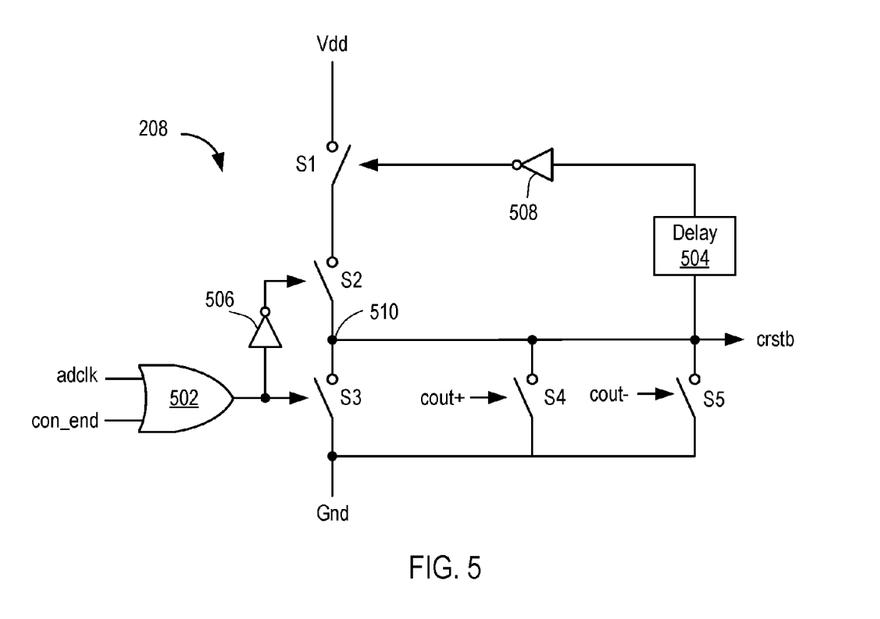
FIG. 5 is a schematic diagram depicting an asynchronous clock generator (ACG) according to an example.

FIG. 5 is a schematic diagram depicting the ACG 208 according to an example. The ACG 208 includes an OR gate 502, a delay circuit 504, inverters 506 and 508, and switches S1 through S5. The switches S1, S2, and S3 are coupled in series between a supply voltage Vdd and a ground voltage Gnd. The switch S1 is controlled by an output of the inverter 508. The switch S2 is controlled by an output of the inverter 506. The switch S3 is controlled by an output of the OR gate 502. Inputs of the OR gate 502 receive the signal adclk and con_end, respectively. An input of the inverter 506 is coupled to the output of the OR gate 502. The switches S2 and S3 are connected by a node 510. The switches S4 and S5 are coupled between the node 510 and the ground voltage Gnd. The switch S4 is controlled by the signal cout+. The switch S5 is controlled by the signal cout−. The delay circuit 504 is coupled between the node 510 and an input of the inverter 508. The node 510 provides the signal crstb.

In operation, the ACG 208 asynchronously generates the signal crstb using the signal pair cout+/− generated by the COM 206. The signal adclk is used as an initial reset before ADC conversion starts. The signals cout+ and cout− asynchronously generate the signal crstb along with the switches S1 through S5 and the delay circuit 504. The con_end signal is a control signal that indicates when to suspend SAR operation. When the con_end signal is de-asserted, SAR operation continues. When the con_end signal is asserted, the crstb signal is forced to be de-asserted.

Figure 6:
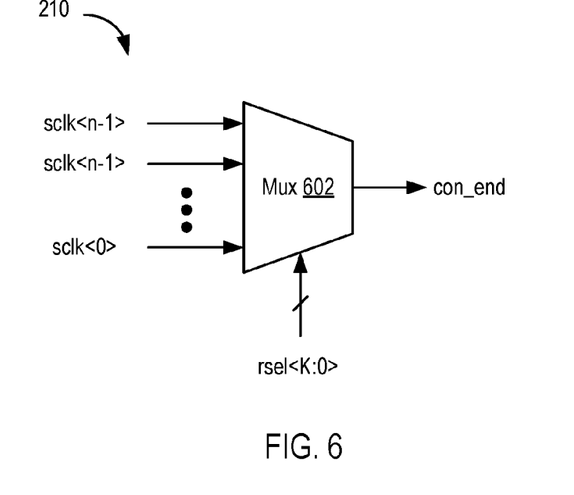
FIG. 6 is a block diagram depicting a resolution selection circuit according to an example.

FIG. 6 is a block diagram depicting the RS 210 according to an example. The RS 210 includes a multiplexer 602. Inputs of the multiplexer 602 receive the sequential clock signals sclk<n-1> . . . sclk<0> from the SL 212. An output of the multiplexer 602 provides the signal con_end. A control input of the multiplexer 602 receives the signal rsel<K:0>. Thus, the signal con_end is a selected one of the sequential clock signals sclk based on the value of rsel<K:0>. That is, the value of rsel<K:0> selects at which SAR cycle the SAR ADC 200 terminates SAR operation in each conversion cycle.

Figure 7:
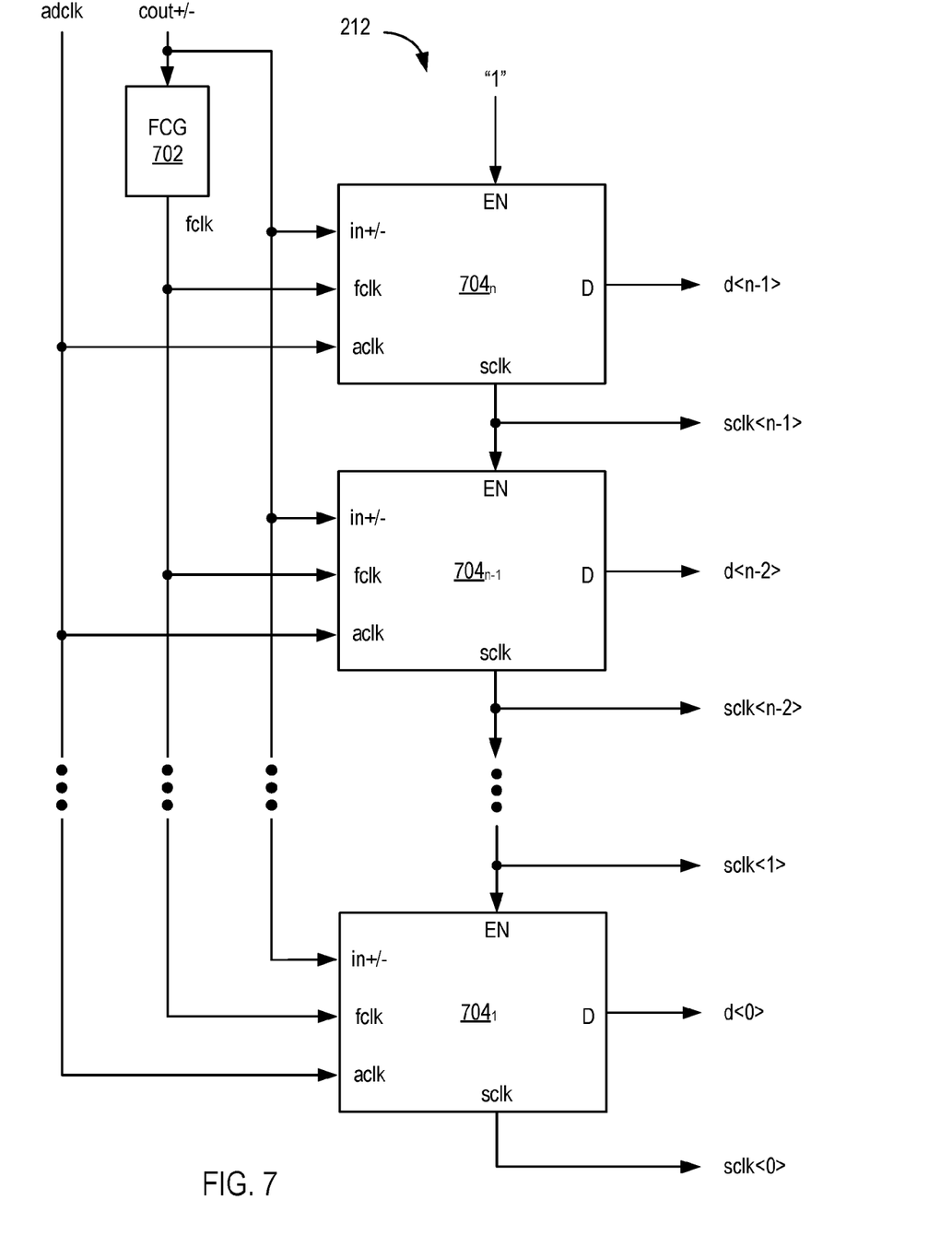
FIG. 7 is a block diagram depicting SAR logic according to an example.

FIG. 7 is a block diagram depicting the SL 212 according to an example. The SL 212 includes a clock generator circuit ("FCG 702") and SAR cells $704_1$ . . . $704_n$ (generally referred to as SAR cells 704 or a SAR cell 704). Inputs of the FCG 702 receive the cout+ and cout− signals. An output of the FCG 702 provides a digital signal (fclk). Each SAR cell 704 includes: an input in+/− that receives the signal pair cout+/− signal; an input fclk that receives the fclk signal; an input aclk that receives the adclk signal; an output sclk that supplies a respective sclk signal; an output D that supplies a respective output signal d; and an input EN. The input EN of the SAR cell $704_n$ receives a logic '1' signal. The EN inputs of the SAR cells $704_{n-1}$ . . . $704_1$ receive the signals sclk<n-1> . . . sclk<1>, respectively.

The fclk signal is an internal clock signal generated by the FCG 702. Each SAR cell 704 sequentially generates a respective output signal d<n-1> . . . d<0> and a respective sequential clock signal sclk<n-1> . . . sclk<0> every time the COM 206 generates a pulse on one of the cout+/− signals (i.e., a+1 or +1 comparison state is generated). The enable input EN of each SAR cell 704 is generated by the previous SAR cell except for the SAR cell $704_n$, which is always logic '1'. Similar to the ACG 208, the adclk signal is used as an initial reset before the conversion cycle begins.

Figure 8:
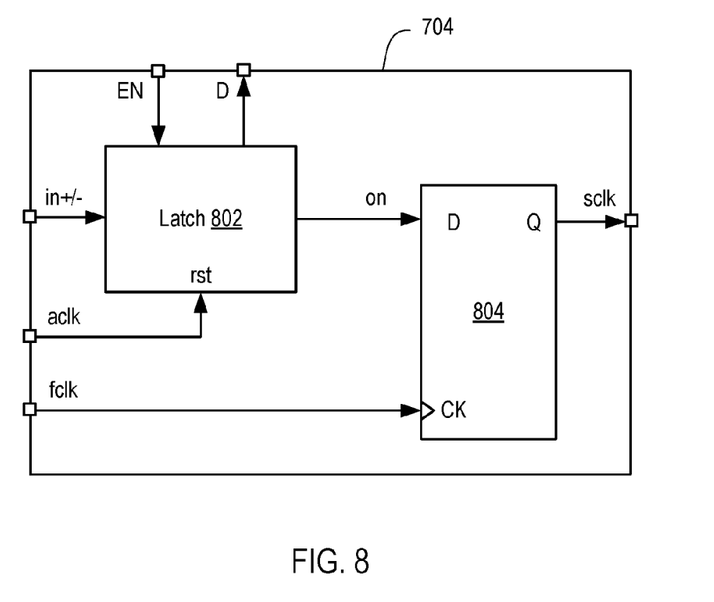
FIG. 8 is a block diagram depicting a SAR cell in the SAR logic of FIG. 7 according to an example.

FIG. 8 is a block diagram depicting a SAR cell 704 according to an example. The SAR cell 704 includes a latch 802 and a flip-flop 804. The latch 802 includes: inputs coupled to the in+/− inputs of the SAR cell 704; an input rst coupled to the aclk input of the SAR cell 704; an input coupled to the EN input of the SAR cell 704; and an output coupled to the D output of the SAR cell 704. The flip-flop 804 includes: an input D; an output Q coupled to the sclk output of the SAR cell 704; and an input CK coupled to the FCLK input of the SAR cell 704. The latch 802 further includes an output (on) coupled to the D input of the flip-flop 804.

In operation, the adclk signal resets the latch 802 at the beginning of a conversion cycle. The latch 802 generates the 'on' signal and a bit of the output signal D when enabled through the EN input of the SAR cell 704. The latch 802 is a dynamic latch. The latch 802 internally generates a latch clock, as well as the signal 'on' when one of the cout+ or cout– signals is asserted. The flip-flop 804 captures the 'on' signal using the fclk signal. The latch 802 asserts the bit of the output signal in response to the +1 comparison state, and de-asserts the bit of the output signal in response to the –1 comparison state.

Figure 9:
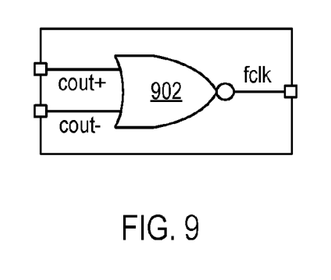
FIG. 9 is a block diagram depicting a clock generator in the SAR logic of FIG. 7 according to an example.

FIG. 9 is a block diagram depicting the FCG 702 according to an example. The FCG 702 includes a NOR gate 902. Inputs of the NOR gate 902 receive the cout+ and cout– signals. An output of the NOR gate 902 supplies the fclk signal. Thus, the fclk signal is de-asserted when the comparison state is +1 or –1 and asserted when the comparison state is the zero state.

Figure 10:
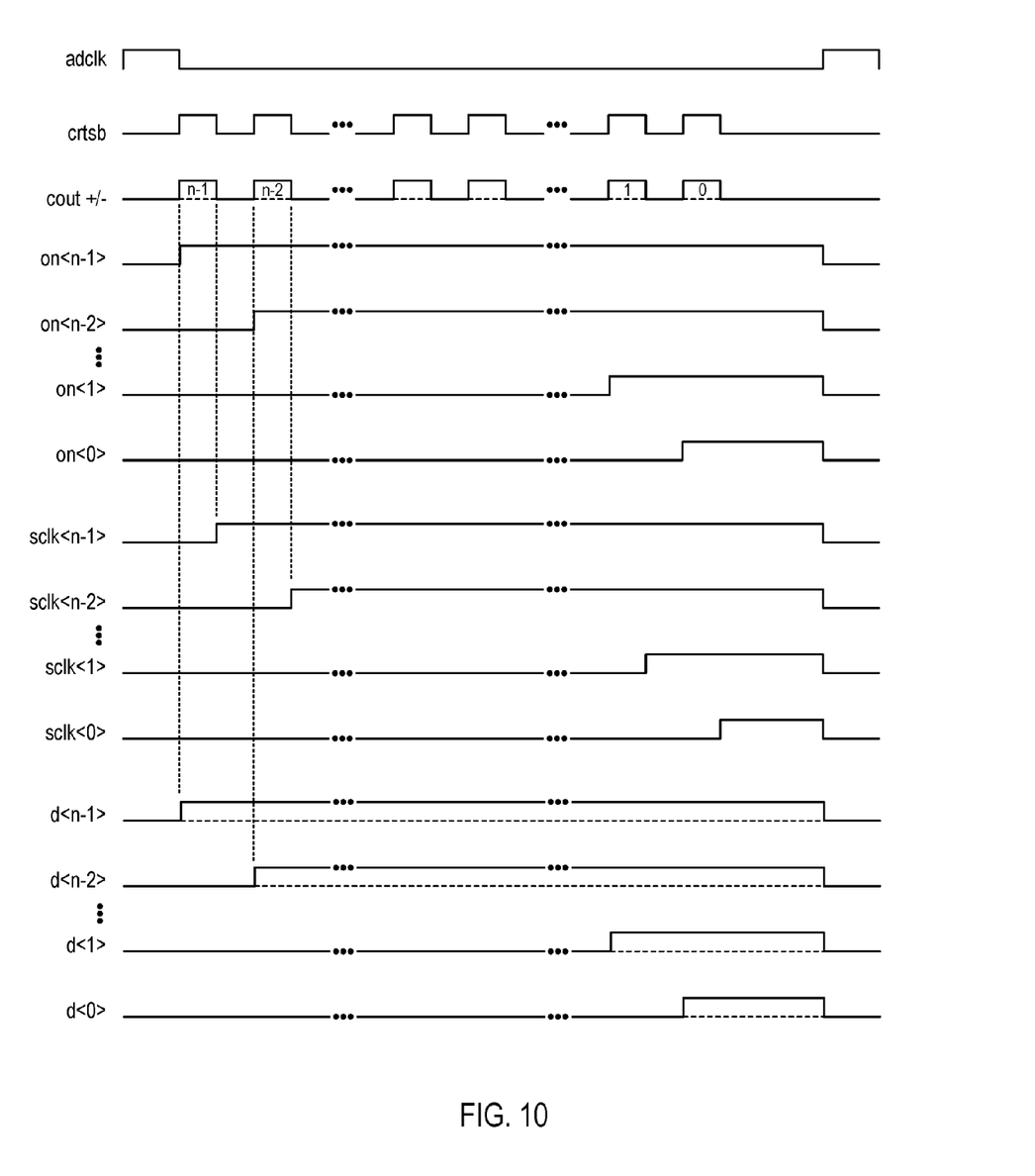
FIG. 10 is a signal diagram depicting signals of the SAR ADC of FIG. 2 according to an example.

FIG. 10 is a signal diagram depicting example signals of the SAR ADC 200 shown in FIGS. 2 and 5-9 for the maximum resolution of n. The signals adclk, crstb, cout+/–, and sclk<n-1> . . . sclk<0> are as described above in FIG. 3. FIG. 10 shows the signals on<n-1>, on<n-2>, on<1>, and on<0>, which are the 'on' signals generated by the latch 802 for the SAR cells 704n, $704_{n-1}$, $704_2$, and $704_1$, respectively. In general, the signals on<n-1>...on<0> are the 'on' signals generated by the latch 802 for the SAR cells $704_n$ . . $704_1$, respectively. The signals on<n-1> . . . on<0> are asserted in sequence across at the beginning of the SAR cycles (n-1) . . . 0. The output signals d<n-1> . . . d<0> are asserted/de-asserted (depending on comparison state) at the start of the SAR cycles (n-1) . . . 0, respectively.

Figure 11:
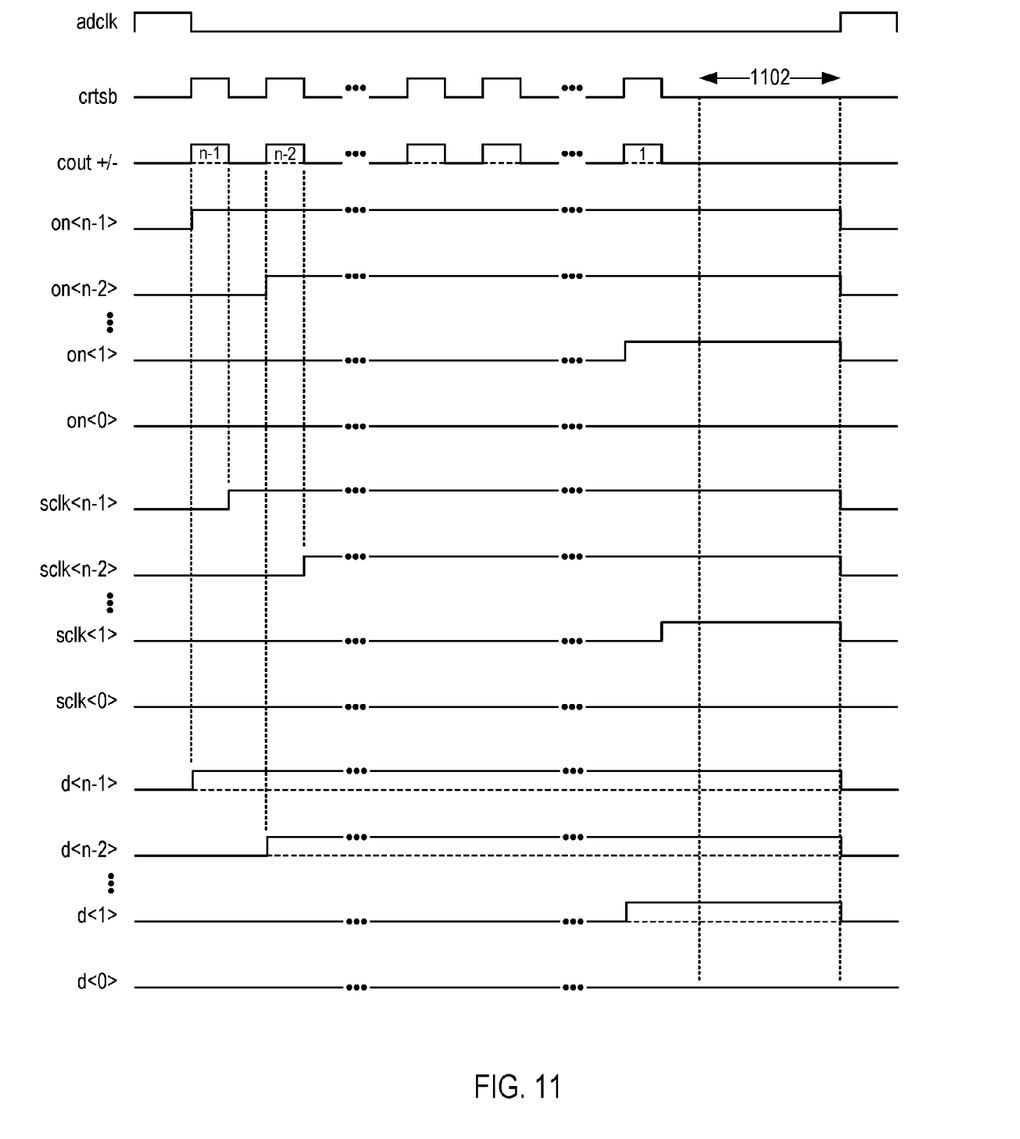
FIG. 11 is a signal diagram depicting signals of the SAR ADC of FIG. 2 according to another example.

FIG. 11 is a signal diagram depicting example signals of the SAR ADC 200 shown in FIGS. 2 and 5-9 for a resolution (n-1). The signals are similar to those shown in FIG. 10 for the resolution n. However, to obtain the resolution (n-1), SAR operation is suspended for the last SAR cycle. Thus, during the time 1102, the COM 206, the ACG 208, the RS 210, and the SL 212 do not perform their respective operations. Thus, the signal pair cout+/– remains in the zero comparison state after the SAR cycle 1. The on<0> signal is not asserted during the conversion cycle. The sclk<0> signal is not asserted during the conversion cycle. The d<0> signal remains de-asserted during the conversion cycle.

Figure 12:
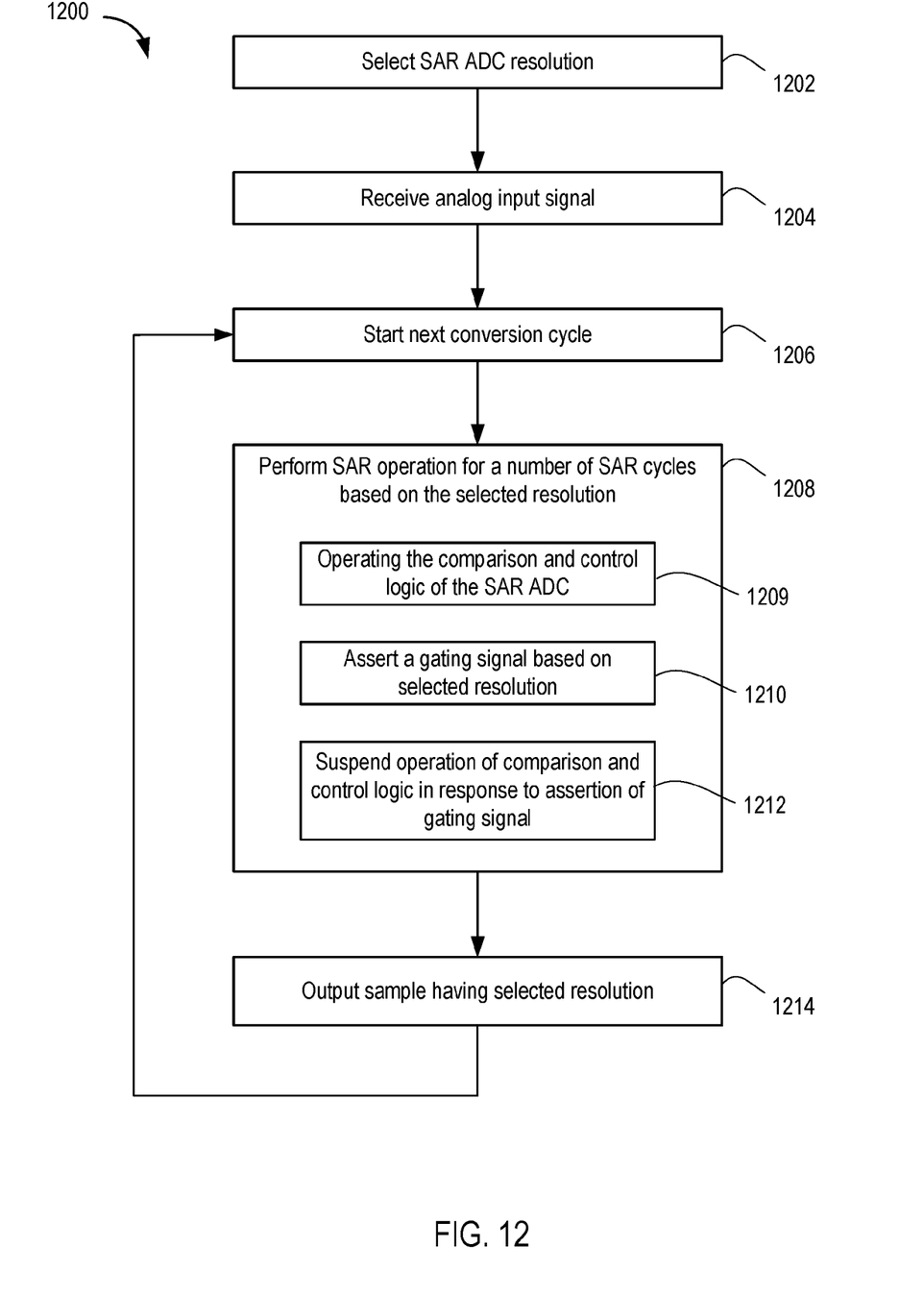
FIG. 12 is a flow diagram depicting a method of analog-to-digital conversion according to an example.

FIG. 12 is a flow diagram depicting a method 1200 of analog-to-digital conversion in the SAR ADC 200 according to an example. The method 1200 begins at step 1202, where the resolution of the SAR ADC 200 is selected. The resolution is selected through the rsel signal input to the RS 210, as described above. At step 1204, the T/H 202 receives an analog input signal. At step 1206, the SAR ADC 200 starts the next conversion cycle. The SAR ADC 200 starts the next conversion cycle by asserting and de-asserting the adclk signal. At step 1208, the SAR ADC 200 performs SAR operation for a number of SAR cycles based on the selected resolution. Thus, if the selected resolution is set to the maximum resolution of n, the SAR ADC 200 performs SAR cycles (n-1) . . . 0 during the conversion cycle. If the selected resolution is set to (n-1), the SAR ADC 200 performs SAR cycles (n-1) . . . 1 during the conversion cycle. If the selected resolution is set to (n-2), the SAR ADC 200 performs SAR cycles (n-1) . . . 2 during the conversion cycle. In general, if the selected resolution is set to m (where n>m≥0), the SAR ADC 200 performs m SAR cycles (n-1) . . . (n-m) during the conversion cycle.

In an example, the step 1208 is performed as follows: At step 1209, the SAR ADC 200 operates comparison and control logic. That is, the COM 206 performs comparison operations, the ACG 208 generates the crstb clock signal, and the SL 212 generates the digital output signal and the sequential clock signals in response to the output of the COM 206. At step 1210, the SAR ADC 200 asserts a gating signal based on a selected resolution. In the example of FIG. 2, the RS 210 asserts the con_end signal based on a resolution selected by the rsel signal. At step 1212, the SAR ADC 200 suspends operation of comparison and control logic in response to assertion of the gating signal. In the example of FIG. 2, the ACG 208 de-asserts the crstb signal in response to assertion of the con_end signal, which suspends the comparison operation performed be the COM 206 and control operations performed by the ACG 208, the RS 210, and the SL 212. In particular, when the comparison operation is suspended, the COM 206 outputs the zero comparison state. When the signal pair cout+/– has the zero comparison state, the ACG 208 and the SL 212 suspend operation.

The method 1200 proceeds from step 1208 to step 1214. At step 1214, the SAR ADC 200 outputs a sample having the selected resolution. In the example of FIG. 2, the SL 212 outputs d<n-1:0> having the selected resolution. The method 1200 returns to step 1206 and repeats for each conversion cycle.

In an example, the SAR ADC 200 has a maximum resolution of n. At step 1202, the selected resolution can be m, where m is an integer less than n and greater than or equal to zero. In each conversion cycle, the number of SAR cycles performed is thus equal to m. At step 1210, the gating signal is asserted after m SAR cycles. At step 1214, the digital sample is generated based on m comparisons performed by the COM 206. At step 1212, the COM 206 and the control logic 250 is suspended for a time period corresponding to m SAR cycles.

Figure 13:
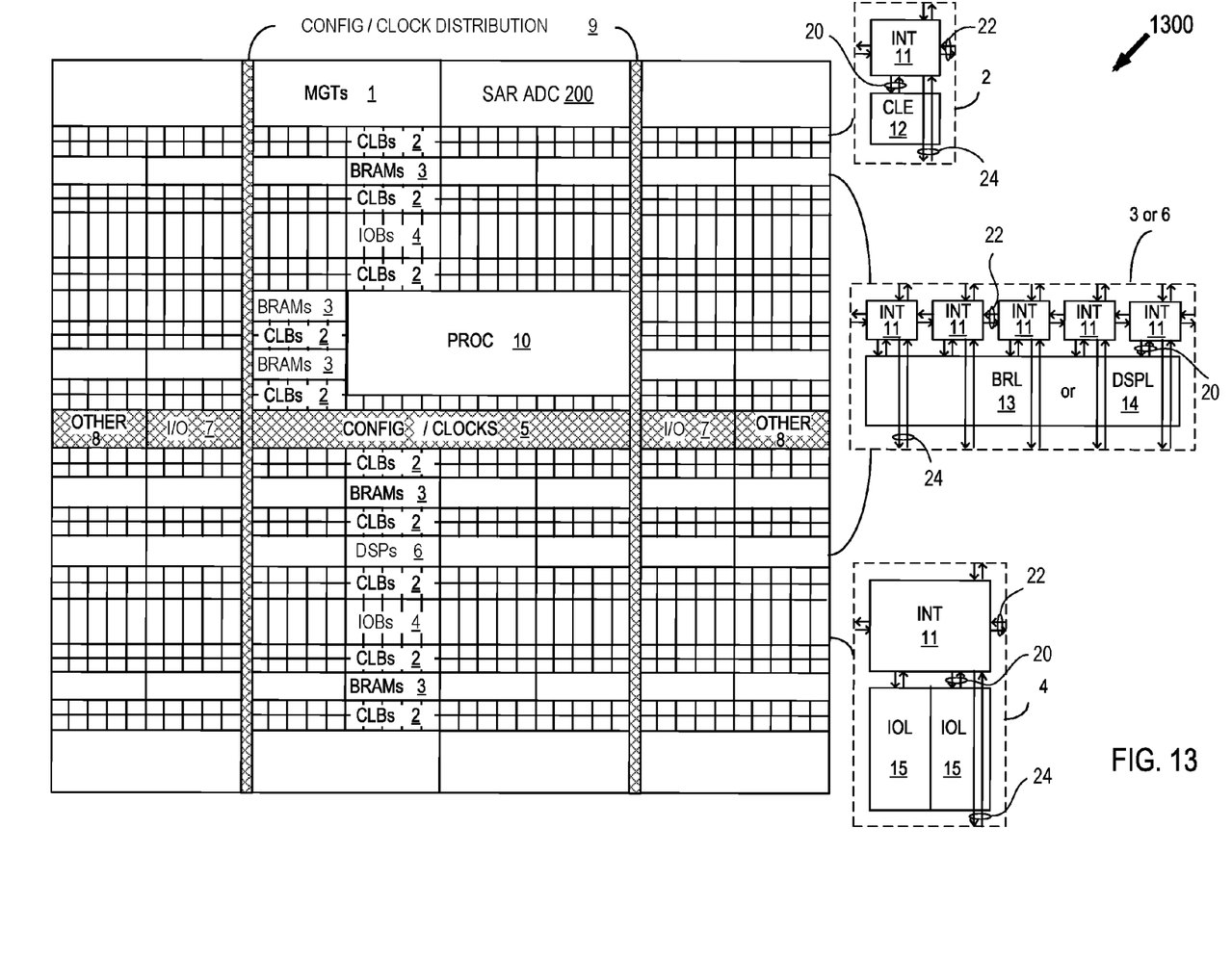
FIG. 13 is a block diagram illustrating an exemplary architecture of an integrated circuit.

The SAR ADC 200 described above can be implemented within an integrated circuit, such as a field programmable gate array (FPGA) or like type programmable circuit. FIG. 13 illustrates an architecture of FPGA 1300 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 1300 can include one or more instances of SAR ADC 200 described above.

In some FPGAs, each programmable tile can include at least one programmable interconnect element ("INT") 11 having connections to input and output terminals 20 of a programmable logic element within the same tile, as shown by examples included at the top of FIG. 13. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 13) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 13 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 13 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 13 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A successive approximation (SAR) analog-to-digital converter (ADC), comprising:
    a track-and-hold (T/H) circuit configured to receive an analog input signal;
    a digital-to-analog converter (DAC);
    an adder having inputs coupled to outputs of the T/H circuit and the DAC;
    a comparison circuit coupled to an output of the adder and configured to perform a comparison operation; and
    a control circuit, coupled to an output of the comparison circuit, configured to: receive a selected resolution; gate the comparison operation of the comparison circuit based on the selected resolution; and generate a digital output signal having the selected resolution, where the control circuit comprises:
        an asynchronous clock generator (ACG) circuit coupled to the comparison circuit:
        SAR logic coupled to the comparison circuit and an input of the DAC; and
        a resolution selection (RS) circuit coupled to the ACG and the SAR logic.

2. The SAR ADC of claim 1, wherein the output of the comparison circuit provides a digital signal pair based on comparing the output of the adder to a threshold, and wherein the ACG is configured to asynchronously generate a clock signal from the digital signal pair.

3. The SAR ADC of claim 2, wherein the digital signal pair are either logical complements of each other or both have a same logic level based on the clock signal generated by the ACG.

4. The SAR ADC of claim 2, wherein the RS circuit is configured to generate a control signal based on a resolution select signal encoding the selected resolution, and wherein the ACG is configured to gate the clock signal based on the control signal generated by the RS.

5. The SAR ADC of claim 4, wherein the SAR logic is configured to generate a plurality of sequential clock signals based on the digital signal pair, and wherein the RS circuit is configured to select one of the plurality of sequential clock signals as the control signal.

6. The SAR ADC of claim 2, wherein the SAR logic comprises:
    a clock generator configured to generate an internal clock signal based on the digital signal pair; and
    a plurality of SAR cell circuits configured to generate a plurality of sequential clock signals and bits of the digital output signal based on the internal clock and the digital signal pair.

7. A receiver, comprising:
    an analog-front-end (AFE) configured to output an analog signal;
    an analog-to-digital converter (ADC) coupled to the AFE;
    a digital signal processor (DSP) coupled to the ADC; and
    an adaptation circuit coupled to the DSP, the ADC, and the AFE;
    the ADC including a plurality of sub-ADCs, each including:
        a track-and-hold (T/H) circuit configured to receive the analog signal from the AFE;
        a digital-to-analog converter (DAC);
        an adder having inputs coupled to outputs of the T/H circuit and the DAC;
        a comparison circuit coupled to an output of the adder and configured to perform a comparison operation; and
        a control circuit, coupled to an output of the comparison circuit, configured to: receive a selected resolution from the adaptation circuit; gate the comparison operation of the comparison circuit based on the selected resolution; and generate a digital output signal having the selected resolution.

8. The receiver of claim 7, wherein the control circuit in each sub-ADC comprises:
    an asynchronous clock generator (ACG) circuit coupled to the comparison circuit;
    SAR logic coupled to the comparison circuit and an input of the DAC; and
    a resolution selection (RS) circuit coupled to the ACG and the SAR logic.

9. The receiver of claim 8, wherein, for each sub-ADC, the output of the comparison circuit provides a digital signal pair based on comparing the output of the adder to a threshold, and wherein the ACG is configured to asynchronously generate a clock signal from the digital signal pair.

10. The receiver of claim 9, wherein, for each sub-ADC, the digital signal pair are either logical complements of each other or both have a same logic level based on the clock signal generated by the ACG.

11. The receiver of claim 9, wherein, for each sub-ADC, the RS circuit is configured to generate a control signal based on a resolution select signal encoding the selected resolution, and wherein the ACG is configured to gate the clock signal based on the control signal generated by the RS.

12. The receiver of claim 11, wherein, for each sub-ADC, the SAR logic is configured to generate a plurality of sequential clock signals based on the digital signal pair, and wherein the RS circuit is configured to select one of the plurality of sequential clock signals as the control signal.

13. The receiver of claim 9, wherein, for each sub-ADC, the SAR logic comprises:
   a clock generator configured to generate an internal clock signal based on the digital signal pair; and
   a plurality of SAR cell circuits configured to generate a plurality of sequential clock signals and bits of the digital output signal based on the internal clock and the digital signal pair.

14. A method of analog-to-digital conversion in a successive approximation (SAR) analog-to-digital converter (ADC), the method comprising:
   selecting a resolution;
   receiving an analog input signal; and
   performing a plurality of conversion cycles, each of the plurality of conversion cycles including:
      performing SAR operation for a number of SAR cycles based on the selected resolution; and
      outputting a digital sample having the selected resolution.

15. The method of claim 14, wherein the step of performing the SAR operation comprises:
   operating comparison and control logic of the SAR ADC;
   asserting a gating signal based on the selected resolution;
   suspending operation of the comparison and control logic in the SAR ADC in response to assertion of the gating signal.

16. The method of claim 15, wherein the SAR ADC has a maximum resolution of n, wherein the selected resolution is m, where m is an integer less than n and greater than or equal to zero, and wherein the number of SAR cycles performed in each of the plurality of conversion cycles is equal to m.

17. The method of claim 16, wherein the gating signal is asserted after m SAR cycles.

18. The method of claim 16, the digital sample is generated based on m comparisons performed by the comparison logic.

19. The method of claim 16, wherein the comparison and control logic is suspended for a time period corresponding to m SAR cycles.

* * * * *